(12) United States Patent
Inam et al.

(10) Patent No.: US 12,041,759 B2
(45) Date of Patent: Jul. 16, 2024

(54) SCALABLE MODULAR COOLING UNIT HAVING VOLTAGE ISOLATION

(71) Applicant: Smart Wires Inc., Union City, CA (US)

(72) Inventors: Haroon Inam, San Jose, CA (US); Ali Farahani, Yorba Linda, CA (US)

(73) Assignee: Smart Wires Inc., Durham, NC (US)

( * ) Notice: Subject to any disclaimer, the term of this patent is extended or adjusted under 35 U.S.C. 154(b) by 0 days.

(21) Appl. No.: 17/375,919

(22) Filed: Jul. 14, 2021

(65) Prior Publication Data

US 2022/0039298 A1 Feb. 3, 2022

Related U.S. Application Data

(60) Provisional application No. 62/706,112, filed on Jul. 31, 2020.

(51) Int. Cl.
*H05K 7/20* (2006.01)

(52) U.S. Cl.
CPC ..... *H05K 7/20927* (2013.01); *H05K 7/20272* (2013.01)

(58) Field of Classification Search
CPC ............ H01L 23/31; H01L 23/34; H01L 23/36–3675; H01L 23/3677; H01L 23/3733; H01L 23/427; H01L 23/46; H01L 23/473; H01L 23/50; H05K 7/2087; H05K 7/20927; H05K 7/20218; H05K 7/20254; H05K 7/2029; H05K 7/20236; H05K 7/20309–20327; H05K 7/20663; H05K 7/20681; H05K 7/20772; H05K 7/20818; H05K 7/20827; H05K 7/20881; H05K 7/20936; H05K 1/201–0212; H05K 1/181–188; H05K 2201/064; H05K 2201/10166; H01H 9/52

See application file for complete search history.

(56) References Cited

U.S. PATENT DOCUMENTS

| | | |
|---|---|---|
| 3,970,820 A | 7/1976 | Mahl |
| 4,224,461 A | 9/1980 | Snyder, Jr. et al. |
| 4,491,681 A | 1/1985 | Kirpich |
| 4,556,471 A | 12/1985 | Bergman et al. |
| 4,667,083 A | 5/1987 | Stol |
| 4,989,070 A | 1/1991 | Iversen et al. |
| 5,074,672 A | 12/1991 | Emery et al. |
| 5,077,536 A | 12/1991 | Fichot et al. |
| 5,226,471 A | 7/1993 | Stefani |
| 5,306,866 A | 4/1994 | Gruber et al. |
| 5,473,907 A | 12/1995 | Briggs |
| 5,760,361 A | 6/1998 | Dew et al. |
| 5,821,491 A | 10/1998 | Dew et al. |
| 6,219,245 B1 * | 4/2001 | Nagashima ........... H01L 23/473 257/E23.098 |
| 6,796,370 B1 * | 9/2004 | Doll ...................... H01L 23/473 257/E23.098 |

(Continued)

*Primary Examiner* — Amir A Jalali
(74) *Attorney, Agent, or Firm* — Womble Bond Dickinson (US) LLP (57) ABSTRACT

A liquid cooling power flow control system and related method are described. The system has switching assemblies for power flow control, in an enclosure. A pump circulates liquid coolant through a liquid cooling block to each switching assembly. The switching assemblies are electrically isolated from the enclosure.

17 Claims, 7 Drawing Sheets

(56) References Cited

U.S. PATENT DOCUMENTS

| | | | |
|---|---|---|---|
| 6,988,534 B2* | 1/2006 | Kenny | G06Q 20/20 |
| | | | 174/15.1 |
| 7,342,236 B2 | 3/2008 | Burtner et al. | |
| 7,511,957 B2 | 3/2009 | Campbell et al. | |
| 7,717,984 B1 | 5/2010 | Schreiber | |
| 7,729,118 B2 | 6/2010 | Lai et al. | |
| 8,879,257 B2* | 11/2014 | Campbell | H05K 7/20836 |
| | | | 361/699 |
| 9,433,524 B2 | 9/2016 | Nadeau | |
| 9,629,280 B2 | 4/2017 | Johnson | |
| 11,342,749 B1* | 5/2022 | Moodie | H02J 3/16 |
| 11,373,929 B1* | 6/2022 | Refai-Ahmed | H01L 23/467 |
| 2005/0248284 A1 | 11/2005 | Burtner et al. | |
| 2007/0091569 A1* | 4/2007 | Campbell | H01L 23/4338 |
| | | | 361/699 |
| 2007/0272392 A1* | 11/2007 | Ghosh | H01L 23/4336 |
| | | | 257/714 |
| 2008/0264604 A1* | 10/2008 | Campbell | H01L 23/427 |
| | | | 165/80.4 |
| 2009/0032937 A1* | 2/2009 | Mann | H01L 23/4735 |
| | | | 165/80.4 |
| 2010/0275971 A1* | 11/2010 | Zingher | H02S 40/22 |
| | | | 136/246 |
| 2011/0315354 A1 | 12/2011 | Johnson | |
| 2012/0048515 A1* | 3/2012 | Bhunia | H01L 23/4735 |
| | | | 165/104.21 |
| 2012/0063091 A1* | 3/2012 | Dede | H05K 7/20927 |
| | | | 174/15.1 |
| 2013/0027884 A1* | 1/2013 | Campbell | H05K 7/20818 |
| | | | 165/104.21 |
| 2014/0190665 A1* | 7/2014 | Joshi | H01L 23/4735 |
| | | | 165/104.19 |
| 2015/0043164 A1* | 2/2015 | Joshi | G06F 1/20 |
| | | | 165/185 |
| 2015/0196423 A1 | 7/2015 | Nadau | |
| 2016/0183409 A1* | 6/2016 | Zhou | H05K 7/20263 |
| | | | 165/104.31 |
| 2016/0242313 A1* | 8/2016 | Singh | H05K 3/0061 |
| 2016/0254207 A1* | 9/2016 | Wilkerson | H01L 23/3731 |
| | | | 257/288 |
| 2017/0055378 A1* | 2/2017 | Zhou | H05K 7/20927 |
| 2017/0092565 A1* | 3/2017 | Chen | H05K 7/20281 |
| 2017/0094837 A1* | 3/2017 | Joshi | H05K 7/20327 |
| 2018/0254470 A1 | 9/2018 | LePort et al. | |
| 2019/0252949 A1* | 8/2019 | Woody | H02P 27/06 |
| 2019/0296657 A1* | 9/2019 | Chung | H02M 7/53875 |
| 2019/0343020 A1* | 11/2019 | Todorovic | H05K 9/0022 |
| 2020/0006197 A1* | 1/2020 | Hart | H01L 25/115 |
| 2020/0227334 A1* | 7/2020 | Hart | H01L 25/115 |

\* cited by examiner

SCALABLE MODULAR COOLING UNIT HAVING VOLTAGE ISOLATION

This application claims benefit of priority from U.S. Provisional Application No. 62/706,112 filed Jul. 31, 2020, which is hereby incorporated by reference.

TECHNICAL FIELD

Embodiments of the disclosure relate to liquid-cooled flexible AC transmission systems (FACTS), with voltage isolation enabling series connected impedance injection modules.

BACKGROUND

Modern-day distributed power generation and distribution systems have introduced multi-generator grids and new modes of operation. These new modes of operation may introduce power electronic (PE) converters, such as power flow control systems used to inject reactive impedance or reactive power into transmission lines. These systems generally include high current devices that generate high thermal loads. To date, power flow control systems have typically used air cooling for heat dissipation. There is a need in the art for liquid cooling configurations adapted for use in power flow control systems.

SUMMARY

Various embodiments of a liquid cooling system, a power flow control system, and related method for liquid cooling in a power flow control system are described herein.

One embodiment is a liquid cooling power flow control system. The system has an enclosure, a liquid cooling block, a pump, and switching assemblies. The liquid cooling block has an input port and an output port. The pump is for circulating liquid coolant. The switching assemblies are for power flow control. The switching assemblies are contained within an enclosure and are electrically isolated from the enclosure. Each switching assembly has a baseplate arranged to thermally couple to the liquid coolant.

One embodiment is a method for liquid cooling in a power flow control system. The method includes circulating liquid coolant through a liquid cooling block. The liquid coolant is circulated to each of the switching assemblies. Each switching assembly has a baseplate. The liquid coolant is circulated using a pump. The method includes electrically isolating each of the switching assemblies from the enclosure of the power flow control system.

Other aspects and advantages of the embodiments will become apparent from the following detailed description taken in conjunction with the accompanying drawings which illustrate, by way of example, the principles of the described embodiments.

BRIEF DESCRIPTION OF THE DRAWINGS

The described embodiments and the advantages thereof may best be understood by reference to the following description taken in conjunction with the accompanying drawings. These drawings in no way limit any changes in form and detail that may be made to the described embodiments by one skilled in the art without departing from the spirit and scope of the described embodiments.

DETAILED DESCRIPTION

A modular liquid cooling block (LCB) is described for cooling high current switching devices deployed in power flow control systems. Liquid coolant may be jetted directly onto a base plate of an IGBT switching module (direct impingement) or it may impinge indirectly on a cooling plate that is thermally coupled to the IGBT base plate (indirect impingement). Indirect impingement may comprise jets of coolant impinging on the cooling plate, or a parallel flow of coolant past the cooling plate. Voltage isolation of switching modules is provided within each LCB and between LCBs, enabling many different series and parallel switching topologies. Problematic ionization of the liquid coolant may occur at electric fields exceeding around 1500V DC potential between switching modules. To avoid such ionization the switching modules are spaced apart and insulating materials are used.

In a first aspect of the present disclosure, a liquid cooled subsystem includes within an enclosure a liquid cooling block (LCB) with input and output ports. A pump circulates liquid coolant in the LCB as part of a closed-circuit fluid assembly that also includes a radiator for transferring heat to an air ambient. Switching assemblies isolated from the enclosure and connectable in series or in parallel are thermally coupled to the LCB through a baseplate. Liquid coolant may impinge directly on the baseplate or indirectly onto a cooling plate thermally coupled to the baseplate. Each switching assembly may be configured to produce a DC output, for example, between 500V and 3,000V for injecting reactive power into a power transmission line. Each switching assembly may include a half bridge or a full bridge. Each series and parallel combination of switching assemblies may correspond to a different converter topology for injecting reactive power.

The liquid coolant may comprise mixtures of water and ethylene glycol or polyethylene glycol, although any liquid coolant may be used. If water is used it may be distilled water or de-ionized water.

In a second aspect of the present disclosure a power flow control module includes a bank of capacitors connected in parallel to form a DC capacitor, and switching assemblies thermally coupled to an LCB and electrically coupled to the DC capacitor. Liquid coolant circulates in the LCB. Each switching assembly is electrically isolated from the enclosure with an electrical isolation of at least 6,000V, as an example. The power flow control module may be configured to inject reactive impedance of at least 1 milli-ohm (me) into a power transmission line. The power flow control module may employ replaceable components, have an operational lifetime of at least 20 years and operate in ambient temperatures, for example, from −40° C. to 50° C. In some embodiments, less than 10 liters of liquid coolant may be used and may be replaceable. The pressure may not exceed 2 bar.

A third aspect of the present disclosure includes a power flow control system having an enclosure, multiple power flow control modules, a bank of capacitors forming a DC capacitor, and an LCB in which liquid coolant circulates. A high-power switching assembly is thermally coupled to the LCB and electrically coupled to the DC capacitor while being electrically isolated from the enclosure. The power flow control system may be configurable to inject reactive power of at least 10 MVA, for example, into a power transmission line. A bypass circuit configured to carry excess current may be connected in parallel with the power flow control system. The bypass circuit may include a vacuum switched link and a bank of silicon-controlled rectifiers connected in parallel. A mechanical switch may be used. Each of the power flow control modules is electrically isolated from the enclosure and may be connected in series or in parallel with other power flow control modules.

Figure 1:
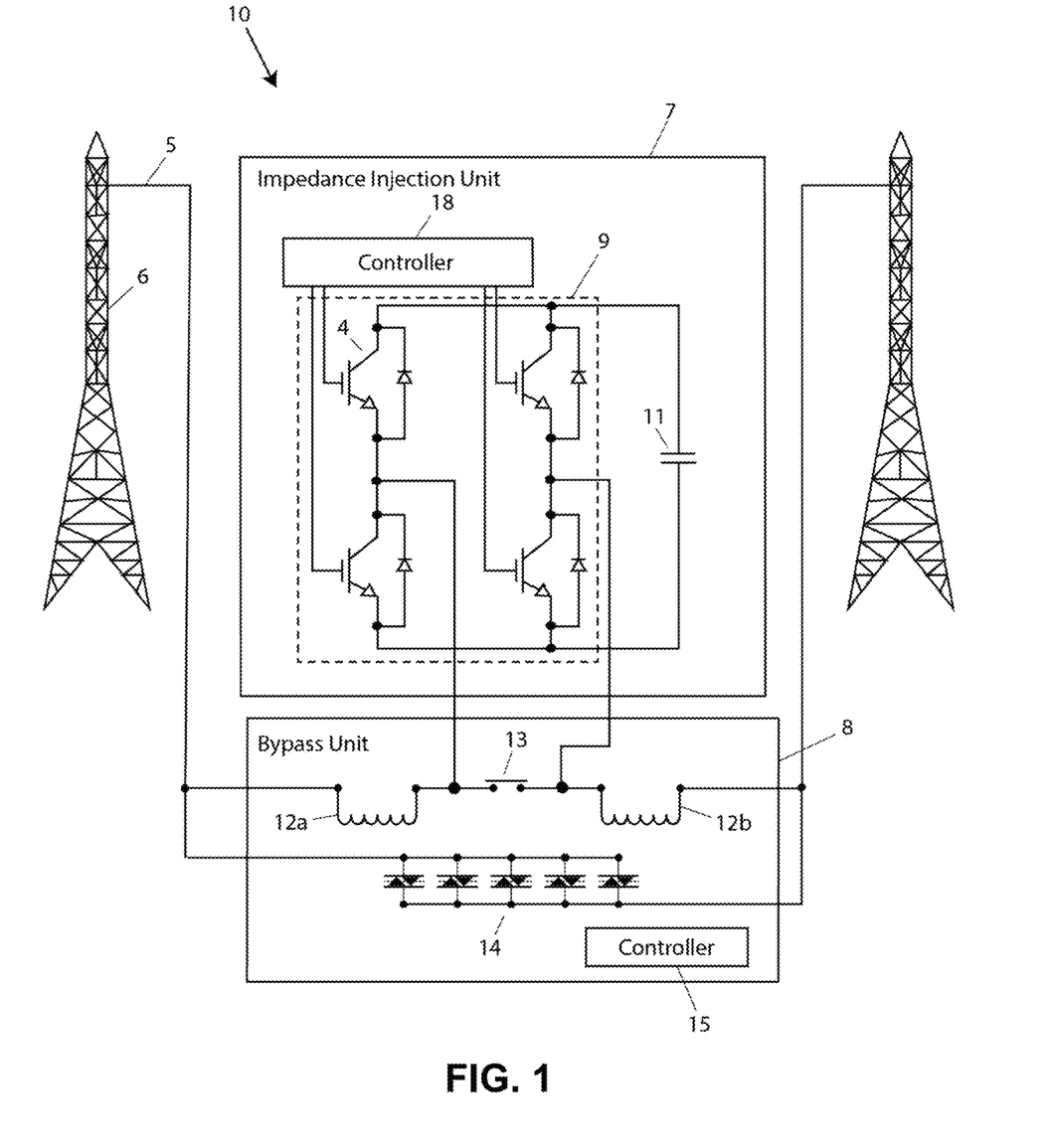
FIG. 1 is a schematic drawing of an impedance injection unit and a bypass unit connected into a power transmission line according to one embodiment.

FIG. 1 illustrates a power flow control system 10, series connected into a power transmission line 5 supported by a transmission line tower 6. A power transmission line may comprise a high-voltage transmission line (e.g. as high as 500 kV), a medium-voltage transmission line (e.g. 230 kV) or a distribution line (e.g. 13 kV). It may reside inside or outside of a switching station. Power flow control system 10 includes an impedance injection unit 7 and a bypass unit 8. Impedance injection unit 7 may include a high-power switching assembly 9 comprising high-power switching devices 4, configured to inject reactive power into power transmission line 5 by charging and discharging a DC capacitor 11. Switching assembly 9 may include a full bridge as shown, or a half bridge. Bypass unit 8 includes differential mode chokes (DMCs) 12a, 12b, a vacuum switched link 13, a bank 14 of silicon-controlled rectifiers (SCRs), and a bypass controller 15. The bypass unit 8 may include a bypass path comprising a mechanical switch.

Figure 2:
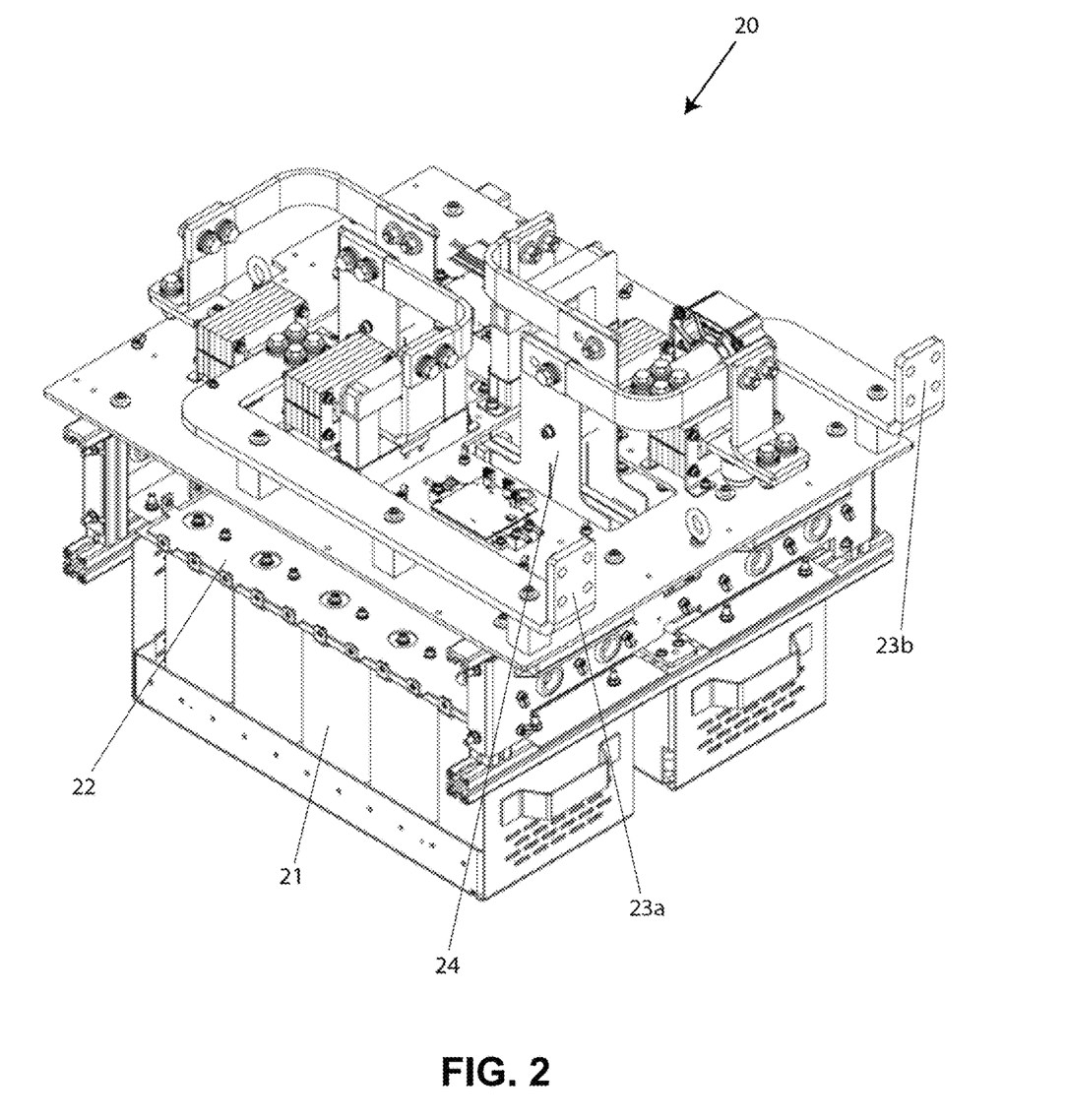
FIG. 2 is a perspective view of an impedance injection unit separated from an enclosure according to one embodiment.

FIG. 2 is a perspective view of an impedance injection unit separated from an enclosure according to one embodiment. In FIG. 2, an impedance injection unit 20 (also referred to as power flow control unit) is configured to inject reactive power (e.g., 1 Mega Volt Amp (MVA)) into a power transmission line. Impedance injection unit 20 includes multiple high-power switching assemblies 9 described in reference to FIG. 1. A capacitor 21 is shown, one of a bank of capacitors implementing DC capacitor 11, connected to DC bus 22. Terminals 23a and 23b denote connection points of an AC bus 24 to the power transmission line 5. The components of impedance injection unit 20 may be replaceable and may have an operating lifetime greater than 20 years for example.

Figure 3:
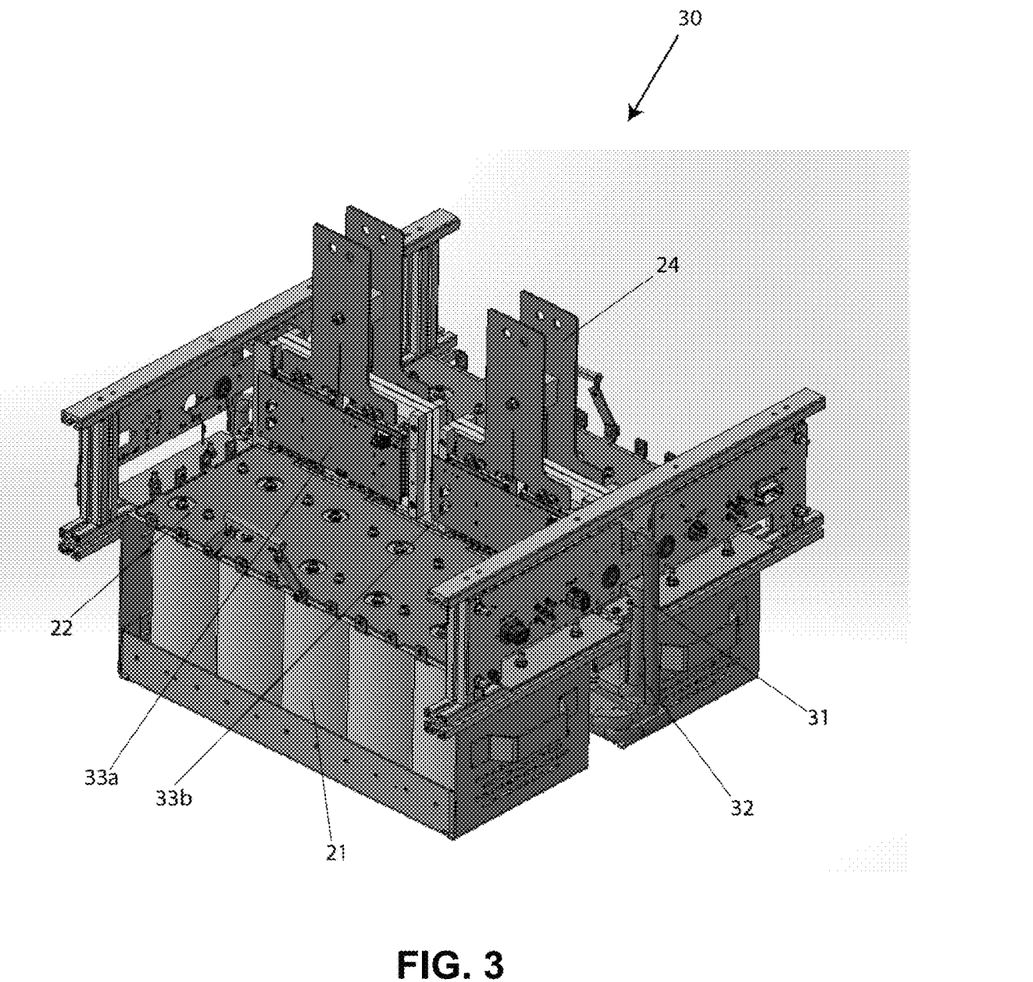
FIG. 3 is a perspective internal view of an impedance injection unit showing liquid cooling blocks according to one embodiment.

FIG. 3 shows a partially disassembled impedance injection unit 30. In some embodiments, impedance injection unit 30 is impedance injection unit 20 of FIG. 2. Referring to FIG. 3, inlet pipe 31 and outlet pipe 32 carry liquid coolant to LCBs that are hidden behind printed circuit boards 33a and 33b, with each circuit board 33a and 33b hosting control circuits for a high-power switching assembly associated with the corresponding LCB. Capacitor 21 and DC bus 22 are also shown.

Figure 4:
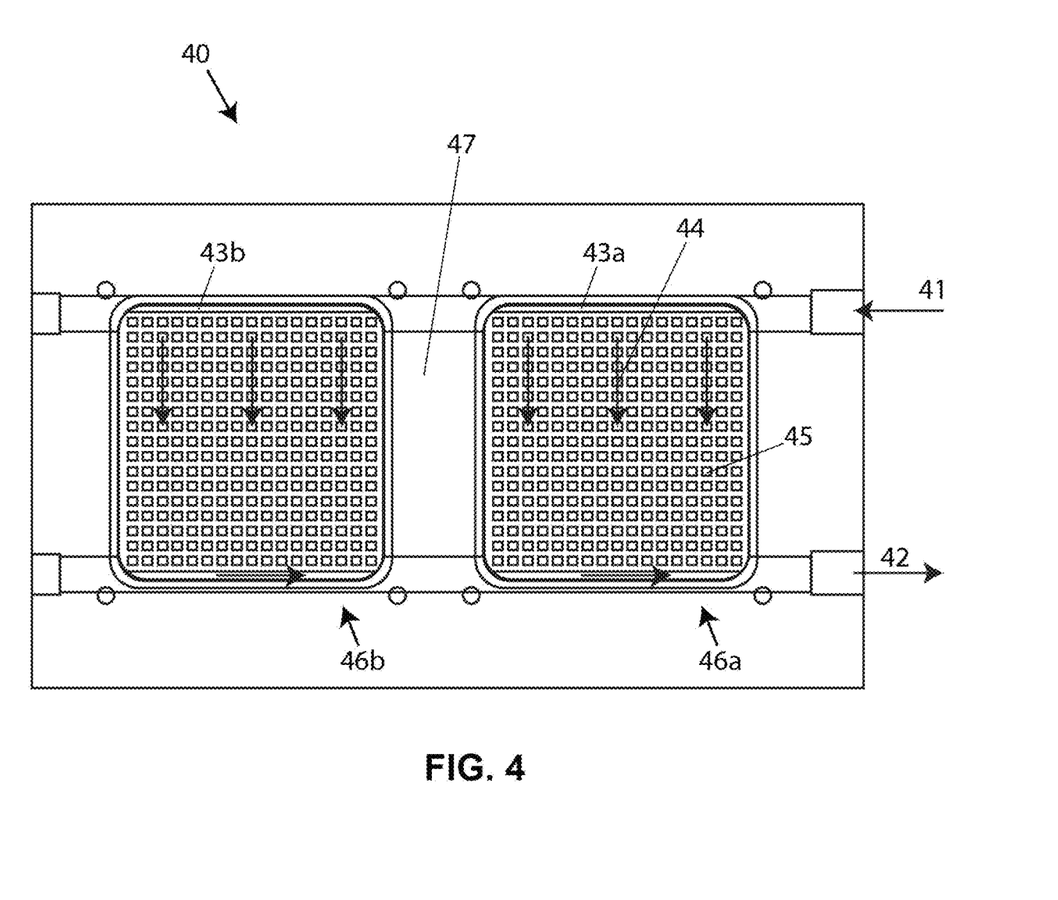
FIG. 4 is a schematic view of a liquid cooling block showing parallel flow of the liquid coolant according to one embodiment.

FIG. 4 depicts parallel flow of liquid coolant in an LCB. An inlet port 41 (connecting to inlet pipe 31 of FIG. 3) and outlet port 42 (connecting to outlet pipe 32 of FIG. 3) are shown. The LCB is shown with two cooling assemblies, 46a and 46b, separated by an insulating material 47. In this embodiment, coolant is released through jetting apertures configured as slots 43a, 43b in a parallel flow arrangement indicated by arrows 44. The coolant impinges on a cooling plate that may have three-dimensional surface features 45; surface features 45 (which may be optional in some embodiments) increase the contact area of coolant and thereby increase heat transfer from liquid coolant to cooling plate. Surface features 45 may comprise raised areas having square or trapezoidal shapes for example. The liquid coolant may be a combination of one or more of distilled water, de-ionized water. ethylene glycol, and polyethylene glycol for example, although any suitable liquid coolant may be used. The liquid coolant may have an operating pressure (less than 2 bar for example) and may be compatible with an operating temperature (e.g., −40° C. to 50° C.) for the associated impedance injection module. The amount of liquid coolant required for an impedance injection unit 20 may be less than 10 liters for example but may be more or less in other embodiments. The liquid coolant may be replaceable or may be contained in a sealed manner that does not require replacement.

Liquid cooling blocks of the present disclosure may be configured to provide individualized flow channels using direct impingement, indirect impingement, and parallel flow. For direct impingement, the jets of cooling fluid impinge directly on a base plate of a high-power switching assembly. For indirect impingement, the jets of cooling fluid impinge on a cooling plate of the LCB that is thermally coupled to the base plate. For parallel flow, the coolant fluid exits from a jetting aperture configured as a slot and passes with parallel flow over the cooling plate. The cooling plate is thermally coupled to an electronic module with a low thermal resistance between them.

Problematic ionization of the liquid coolant may occur at electric fields produced by a potential (e.g., around 1500 VDC) between switching modules. To avoid such ionization the switching modules are spaced apart with an adequate separation distance, and insulating materials are used. The insulating materials may include fiber reinforced plastic (FRP) or nylon for example, and the separation distance may be greater than 8 mm for example.

Figure 5:
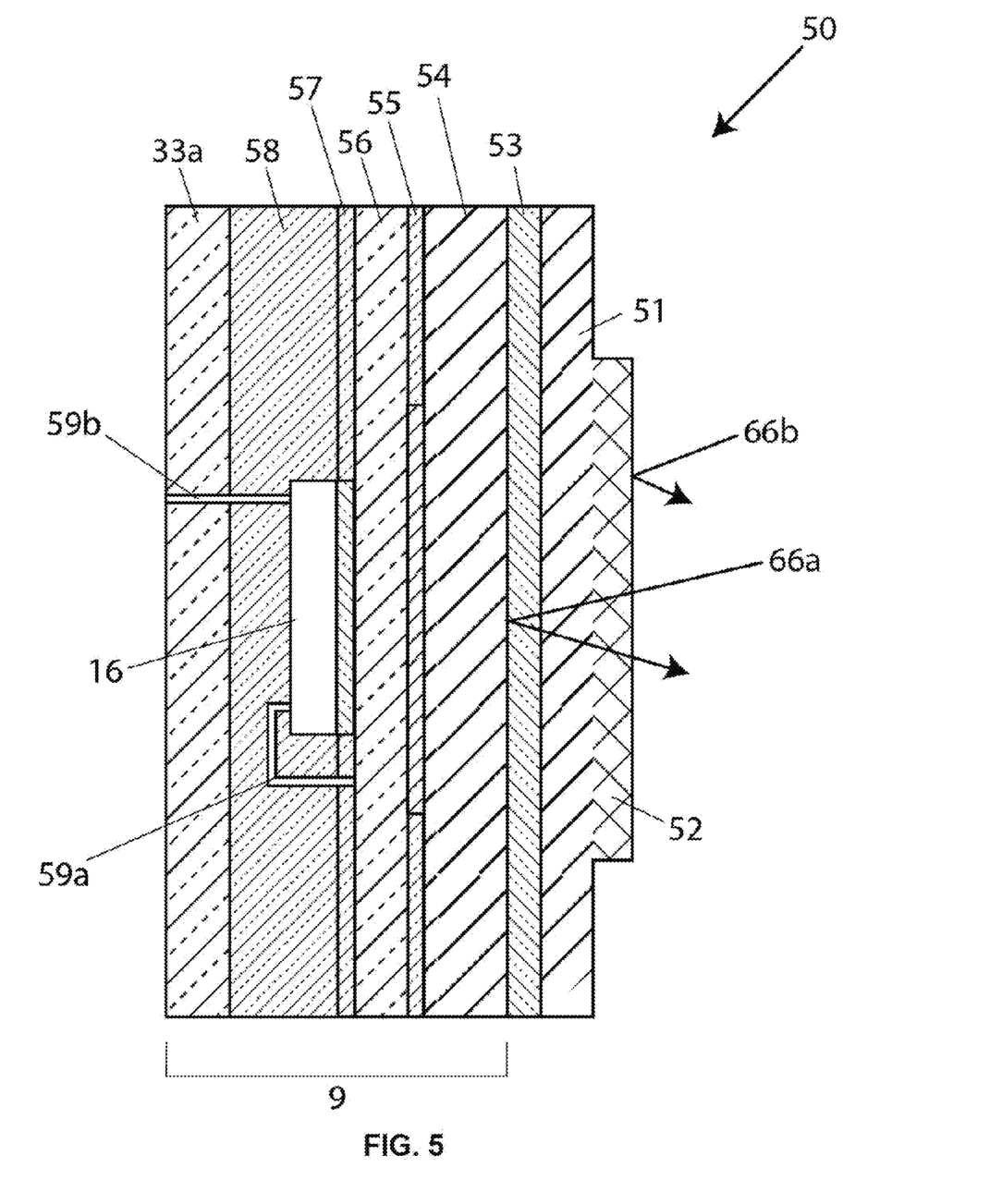
FIG. 5 is a cross-sectional view of a suitable thermal structure for coupling a cooling plate to a high-power switching device contained within a high-power switching assembly according to one embodiment.

FIG. 5 illustrates an example thermal construction for providing a low thermal resistance path between liquid coolant impinging on a cooling plate surface and high-power switching devices that are part of a high-powered switching assembly 9. Cooling plate 51 is shown with raised surface features 52. Cooling plate 51 is coupled through a sheet 53 of thermal interface material (TIM) to a base plate 54 of a high-power switching assembly 9. High-power switching device 16 may be an insulated gate bipolar transistor (IGBT), for example, and may be part of a half-bridge or a full-bridge configured to charge and discharge DC capacitor 11 to achieve injection of a reactive impedance into a power transmission line 5 for example. The thermal path may include solder 55, a ceramic sheet 56 on which wire bonds 59a connecting to an active device 16 are terminated, and a second sheet 57 of thermal interface material. A potting material 58 such as silicone may be used to fill air gaps surrounding high-power switching device 16. A printed circuit board 33a is shown, providing control inputs 59b to high-power switching devices 16. As shown in FIG. 5, in a direct impingement embodiment, cooling fluid jets 66a impinge directly on the base plate 54 of high-power switching assembly 9. In an indirect impingement embodiment, cooling fluid jets 66b impinge on the cooling plate 51 that is thermally coupled to the base plate 54 through sheet 53.

Figure 6:
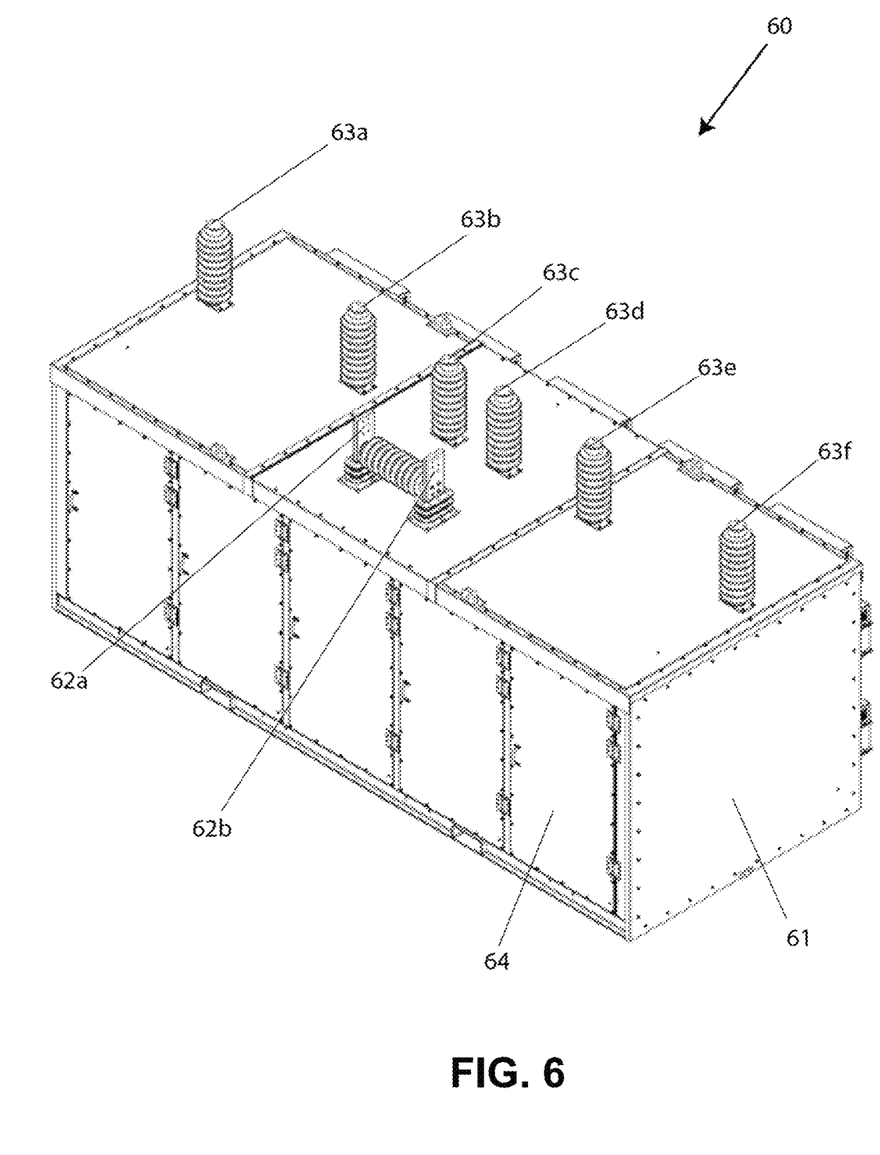
FIG. 6 illustrates an enclosed power flow control system according to one embodiment.

FIG. 6 illustrates a power flow control system 60 that includes ten power flow control units 20 described in reference to FIG. 2. Power flow control system 60 is contained within an enclosure 61 and may be configured to provide reactive power (e.g., 10 MVA) for injection into a power transmission line for example. In other embodiments, higher amounts of reactive power may be achieved and/or other numbers of power flow control unit 20 may be used. Terminals 62a and 62b are shown for connecting to a power transmission line 5. The ten power flow control units 20 may be arranged with two parallel units comprising a dual unit, and five dual units connected in series, though other combinations may be used. Parallel units are used to increase the level of injected current, and series units provide a desired level of injected voltage. Terminals 63a through 63f provide connection points for the dual units. A door 64 provides access for installing a dual unit or other equipment in enclosure 61.

A rail system may be used for mounting the various modules of power flow control system 60, enabling convenient access for maintenance and replacement, as necessary.

Figure 7:
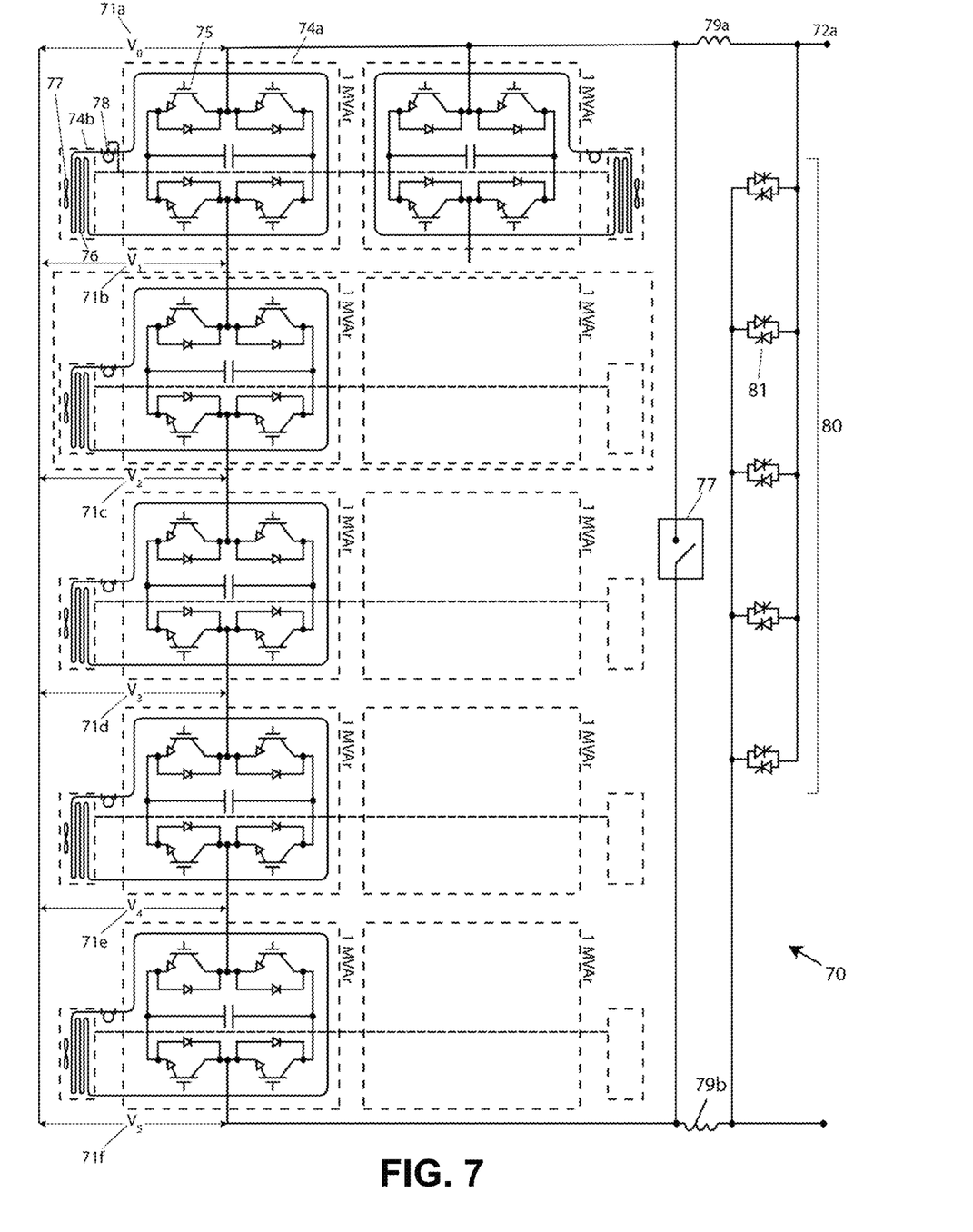
FIG. 7 is a schematic showing voltage isolation between high-power switching assemblies and an enclosure of a power flow control system according to one embodiment.

FIG. 7 is a schematic 70 that illustrates a power flow control system 60 having voltage isolation between each dual unit and the enclosure 61. The input potential at the first dual unit is shown as V0, 71a, and the output potential is shown as V1, 71b. For units in series, each voltage 71a, 71b, 71c, 71d, 71e, 71f may exceed a prior voltage level by the amount of voltage injection by each dual unit, 0.8 kV for example. In this example, voltage isolation exceeding 0.8 kV is provided between each dual unit. This is necessary to enable series connection of the units required for desired levels of injection of reactive power into a power transmission line connected between nodes 72a and 72b. At node 71f, the level of voltage isolation between the 5th dual unit and the enclosure 61 is required to be greater than 5×0.8 kV or 4.0 kV in this example.

Isolated assemblies 74a and 74b are shown. Isolated assembly 74a includes a power switching assembly 75 that may comprise a set of four insulated gate bipolar transistors (IGBTs) connected as shown for injecting power from the DC capacitor 11 (see FIG. 1) onto the power transmission line 5. Each of the IGBTs depicted may comprise two or more IGBT chips connected in parallel. Isolated assembly 74b comprises thermal cooling equipment including a radiator 76, a fan 77 and a pump 78. Each power switching assembly 75 is associated with an LCB, such as LCB 40 (see FIG. 4). Isolated assemblies 74a and 74b may comprise structural members fabricated using non-electrically conductive materials such as fiber reinforced plastic (FRP). One version of FRP comprises a polyester resin and has an operating temperature, for example, up to around 140° F. Another version of FRP comprises an epoxy resin and has an operating temperature, for example, up to around 240° F. Although not required for voltage isolation, tubing for circulating the coolant may comprise a non-electrically conductive material, such as silicone. As an example, each power switching assembly 75 may be provided with an electrical isolation (e.g., at least 6,000V of electrical isolation) from enclosure 61.

Bypass circuits may also be included, such as a vacuum switched link (VSL) 77 for providing an alternate path for bypass current. Current limiting chokes 79a and 79b may be provided as shown. A bank 80 of SCRs 81 may be provided in parallel as shown, used for bypassing high currents during fault conditions on the associated power transmission line. Each SCR 81 must be capable of withstanding the isolation voltage, such as 4.0 kV shown on node 71f.

The teachings contained in the embodiments described herein may be applied to stand-alone liquid cooled electronic modules, and to liquid cooled power flow control units and systems.

The foregoing description, for the purpose of explanation, has been described with reference to specific embodiments. However, the illustrative discussions above are not intended to be exhaustive or to limit the invention to the precise forms disclosed. Many modifications and variations are possible in view of the above teachings. The embodiments were chosen and described in order to best explain the principles of the embodiments and its practical applications, to thereby enable others skilled in the art to best utilize the embodiments and various modifications as may be suited to the particular use contemplated. Accordingly, the present embodiments are to be considered as illustrative and not restrictive, and the invention is not to be limited to the details given herein, but may be modified within the scope and equivalents of the appended claims.

What is claimed is:

1. A liquid cooling power flow control system comprising:
an enclosure;
a liquid cooling block having an input port and an output port;
a pump for circulating liquid coolant; and
a plurality of switching assemblies contained within and electrically isolated from the enclosure;
wherein each of the plurality of switching assemblies comprises one or more high-power switching devices configurable to inject reactive power into a power transmission line of a power grid and a base plate arranged to thermally couple to the liquid coolant, the one or more high-power switching devices are embedded within the switching assembly, and the liquid coolant is to impinge only onto a surface of the base plate of the switching assembly.

2. The liquid cooling power flow control system of claim 1, wherein each switching assembly or each pair of switching assemblies, of the plurality of switching assemblies, is configurable to produce an AC output to inject the reactive power into the power transmission line.

3. The liquid cooling power flow control system of claim 1, wherein some switching assemblies, in the plurality of switching assemblies, are connectable in series or in parallel to inject the reactive power into the power transmission line.

4. The liquid cooling power flow control system of claim 1, further comprising non-electrically conductive tubing for circulating the liquid coolant.

5. The liquid cooling power flow control system of claim 1, further comprising a silicon controlled rectifier (SCR) that withstands an isolation voltage of 4000 V.

6. The liquid cooling power flow control system of claim 1, wherein switching assemblies of the plurality of switching assemblies are spaced apart and include insulating materials therebetween.

7. The liquid cooling power flow control system of claim 1, wherein the input port of the liquid cooling block includes a plurality of jetting apertures to produce jets of the liquid coolant.

8. The liquid cooling power flow control system of claim 1, further comprising a thermal path from each of the one or more high-power switching devices of each of the plurality of switching assemblies to the liquid coolant.

9. A liquid cooling power flow control system comprising:
an enclosure;
a liquid cooling block having an input port and an output port;
a pump for circulating liquid coolant; and
a plurality of switching assemblies contained within and electrically isolated from the enclosure;
wherein each of the plurality of switching assemblies comprises one or more high-power switching devices configurable to inject reactive power into a power transmission line of a power grid and a base plate arranged to thermally couple to the liquid coolant, the one or more high-power switching devices are embedded within the switching assembly, and the liquid coolant is to impinge only onto a surface of a cooling plate that is thermally coupled to the base plate of the switching assembly.

10. The liquid cooling power flow control system of claim 9, wherein the cooling plate has raised surface features.

11. The liquid cooling power flow control system of claim 9, wherein the cooling plate is thermally coupled to the base plate through thermal interface material.

12. A method for liquid cooling in a power flow control system, comprising: circulating liquid coolant through a liquid cooling block, to each of a plurality of switching assemblies, using a pump, wherein each of the plurality of switching assemblies comprises one or more high-power switching devices configurable to inject reactive power into a power transmission line of a power grid and a base plate arranged to thermally couple to the liquid coolant, the one or more high-power switching devices are embedded within the switching assembly; and electrically isolating each of the plurality of switching assemblies from an enclosure of the power flow control system; wherein circulating the liquid coolant to each of the plurality of switching assemblies comprises impinging the liquid coolant only onto a surface of a cooling plate that is thermally coupled to the base plate of each of the plurality of switching assemblies.

13. The method of claim 12, further comprising:
connecting switching assemblies, of the plurality of switching assemblies, in series or parallel; and
injecting the reactive power into the power transmission line.

14. The method of claim 12, wherein circulating the liquid coolant to each of the plurality of switching assemblies comprises circulating the liquid coolant to raised surface features of the cooling plate that is thermally coupled to the base plate of each of the plurality of switching assemblies.

15. The method of claim 12, wherein circulating the liquid coolant to each of the plurality of switching assemblies comprises circulating the liquid coolant to the cooling plate coupled to the base plate of each of the plurality of switching assemblies through thermal interface material.

16. The method of claim 12, wherein circulating the liquid coolant to each of the plurality of switching assemblies comprises circulating the liquid coolant through non-electrically conductive tubing.

17. The method of claim 12, wherein circulating the liquid coolant to each of the plurality of switching assemblies comprises producing jets of the liquid coolant that impinge only onto the surface of the cooling plate thermally coupled to the base plate, of each of the plurality of switching assemblies.

* * * * *